(12) United States Patent
Chang et al.

(10) Patent No.: US 9,257,272 B2
(45) Date of Patent: Feb. 9, 2016

(54) DEPOSITED MATERIAL AND METHOD OF FORMATION

(71) Applicant: Taiwan Semiconductor Manufacturing Company, Ltd., Hsin-Chu (TW)

(72) Inventors: Yao-Wen Chang, Taipei (TW); Cheng-Yuan Tsai, Chu-Pei (TW); Hsing-Lien Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/301,897

(22) Filed: Jun. 11, 2014

(65) Prior Publication Data

US 2014/0291745 A1 Oct. 2, 2014

Related U.S. Application Data

(62) Division of application No. 13/275,021, filed on Oct. 17, 2011, now Pat. No. 8,759,234.

(51) Int. Cl.

| | |
|---|---|
| H01L 21/02 | (2006.01) |
| C23C 16/455 | (2006.01) |
| H01L 23/485 | (2006.01) |
| H01L 21/28 | (2006.01) |
| H01L 29/51 | (2006.01) |
| H01L 29/778 | (2006.01) |
| C23C 16/40 | (2006.01) |
| H01L 29/78 | (2006.01) |
| H01L 27/108 | (2006.01) |
| H01L 49/02 | (2006.01) |
| H01L 29/20 | (2006.01) |

(52) U.S. Cl.
CPC ........ *H01L 21/02112* (2013.01); *C23C 16/405* (2013.01); *C23C 16/45525* (2013.01); *H01L 21/022* (2013.01); *H01L 21/0228* (2013.01); *H01L 21/02107* (2013.01); *H01L 21/02109* (2013.01); *H01L 21/02189* (2013.01); *H01L 21/28176* (2013.01); *H01L 23/485* (2013.01); *H01L 27/10808* (2013.01); *H01L 28/40* (2013.01); *H01L 29/517* (2013.01); *H01L 29/7783* (2013.01); *H01L 29/78* (2013.01); *H01L 27/10852* (2013.01); *H01L 28/60* (2013.01); *H01L 29/20* (2013.01); *H01L 2924/0002* (2013.01)

(58) Field of Classification Search
CPC ................. H01L 21/02107; H01L 21/02109; H01L 21/02112; H01L 21/02159; H01L 21/02189; H01L 27/0629
See application file for complete search history.

(56) References Cited

U.S. PATENT DOCUMENTS

| | | | |
|---|---|---|---|
| 6,037,664 A | 3/2000 | Zhao et al. | |
| 6,215,189 B1 | 4/2001 | Toyoda et al. | |
| 6,319,814 B1 | 11/2001 | Tsai et al. | |
| 6,331,479 B1 | 12/2001 | Li et al. | |
| 6,383,913 B1 | 5/2002 | Tsai et al. | |

(Continued)

*Primary Examiner* — Eduardo A Rodela
(74) *Attorney, Agent, or Firm* — Slater & Matsil, L.L.P.

(57) ABSTRACT

A system and method for manufacturing a semiconductor device is provided. An embodiment comprises forming a deposited layer using an atomic layer deposition (ALD) process. The ALD process may utilize a first precursor for a first time period, a first purge for a second time period longer than the first time period, a second precursor for a third time period longer than the first time period, and a second purge for a fourth time period longer than the third time period.

17 Claims, 12 Drawing Sheets

(56) References Cited

U.S. PATENT DOCUMENTS

| | | |
|---|---|---|
| 6,391,795 B1 | 5/2002 | Catabay et al. |
| 6,475,929 B1 | 11/2002 | Gabriel et al. |
| 6,951,826 B2 | 10/2005 | Bencher et al. |
| 6,989,603 B2 | 1/2006 | Zhang |
| 7,056,646 B1 | 6/2006 | Amblard et al. |
| 7,115,993 B2 | 10/2006 | Wetzel et al. |
| 7,531,448 B2 | 5/2009 | Wang |
| 7,592,272 B2 | 9/2009 | Tonomura |
| 7,772,073 B2 | 8/2010 | Clark et al. |
| 7,811,930 B2 | 10/2010 | Wang |
| 7,838,415 B2 | 11/2010 | Chang et al. |
| 8,008,206 B2 | 8/2011 | Liang et al. |
| 8,012,823 B2 | 9/2011 | Lim et al. |
| 8,034,712 B2 | 10/2011 | Chang et al. |
| 8,222,151 B2 | 7/2012 | Liang et al. |
| 2002/0001952 A1 | 1/2002 | Chooi et al. |
| 2002/0171147 A1 | 11/2002 | Yew et al. |
| 2002/0175414 A1 | 11/2002 | Teh et al. |
| 2004/0053501 A1 | 3/2004 | Brennan et al. |
| 2004/0056359 A1 | 3/2004 | Lee et al. |
| 2004/0152299 A1 | 8/2004 | Mahalingam et al. |
| 2005/0017324 A1 | 1/2005 | Yamamoto |
| 2005/0167839 A1 | 8/2005 | Wetzel et al. |
| 2005/0170601 A1* | 8/2005 | Yoon et al. ............ 438/396 |
| 2005/0233519 A1 | 10/2005 | Chang et al. |
| 2005/0239297 A1 | 10/2005 | Senzaki et al. |
| 2005/0271813 A1 | 12/2005 | Kher et al. |
| 2005/0277302 A1 | 12/2005 | Nguyen et al. |
| 2006/0148192 A1 | 7/2006 | Chou et al. |
| 2006/0261376 A1 | 11/2006 | Forbes et al. |
| 2006/0292854 A1 | 12/2006 | Wang |
| 2007/0077780 A1 | 4/2007 | Wang et al. |
| 2007/0232501 A1 | 10/2007 | Tonomura |
| 2008/0006866 A1* | 1/2008 | Lee ........................ 257/301 |
| 2008/0171434 A1 | 7/2008 | Chang et al. |
| 2008/0318414 A1 | 12/2008 | Jeong |
| 2009/0176378 A1 | 7/2009 | Wang |
| 2009/0250736 A1* | 10/2009 | Yoon et al. ............. 257/296 |
| 2009/0269941 A1 | 10/2009 | Raisanen et al. |
| 2010/0022084 A1 | 1/2010 | Chen et al. |
| 2011/0021021 A1 | 1/2011 | Chang et al. |
| 2012/0100717 A1 | 4/2012 | Lii et al. |
| 2013/0270709 A1 | 10/2013 | Tseng et al. |
| 2013/0307066 A1* | 11/2013 | Hsieh ..................... 257/331 |
| 2014/0300000 A1 | 10/2014 | Chao et al. |

\* cited by examiner

DEPOSITED MATERIAL AND METHOD OF FORMATION

This application is a divisional of and claims the benefit of U.S. patent application Ser. No. 13/275,021, filed on Oct. 17, 2011, and entitled "Deposited Material and Method of Formation," which application is incorporated herein by reference.

BACKGROUND

Dielectric materials have been used in the semiconductor manufacturing field for many purposes. They can be used to electrically isolate one region from another region. Additionally, the specific material chosen for the dielectric material may be utilized to help fine tune electromagnetic fields within semiconductor chips so that a wide variety of features may be obtained.

In one example, a capacitor may be formed by manufacturing a first capacitor electrode and a second capacitor electrode separated by a capacitor dielectric material. This capacitor dielectric material allows the first capacitor electrode and the second capacitor electrode to hold the charge when a current is applied. This allows the capacitor to be utilized to temporarily store charges as desired.

However, as the semiconductor devices get smaller and smaller, issues can arise regarding the dielectric layers. In particular, as semiconductor manufacturing races from the 40 nm process node and past the 28 nm process node, the current methods of forming these dielectric layers are simply insufficient to the tasks required to meet the performance and manufacturing specifications that are desired in today's competitive environment.

BRIEF DESCRIPTION OF THE DRAWINGS

For a more complete understanding of the embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the embodiments provide many applicable concepts that can be embodied in a wide variety of specific contexts. The specific embodiments discussed are merely illustrative of specific ways to make and use the embodiments, and do not limit the scope of the embodiments.

The embodiments will be described with respect to embodiments in a specific context, namely a high-k dielectric in a metal-insulator-metal (MIM) capacitor at a 28 nanometer process node. The embodiments may also be applied, however, to other dielectric layers in other uses.

Figure 1:
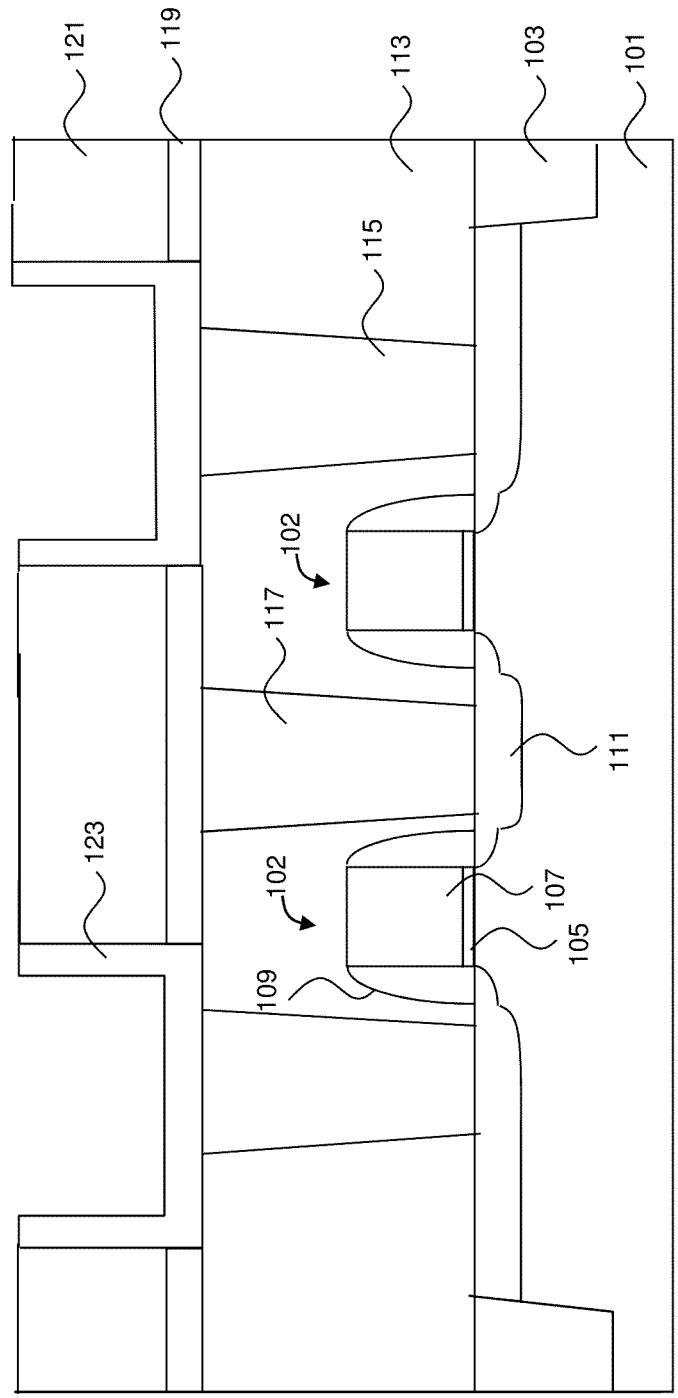
FIG. 1 illustrates a substrate with gate stacks and bottom capacitor electrodes in accordance with an embodiment.

With reference now to FIG. 1, there is shown a substrate 101 with isolation regions 103 within the substrate 101, a plurality of gate stacks 102 on the substrate 101, source/drain regions 111, a first inter-layer dielectric (ILD) layer 113, a first etch stop layer 119, capacitor contacts 115, a lower bit line contact 117, a second ILD layer 121, and bottom capacitor plates 123. The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The isolation regions 103 may be shallow trench isolation (STI) regions, and may be formed by etching the substrate 101 to form a trench and filling the trench with a dielectric material as is known in the art. The isolation regions 103 may be filled with a dielectric material such as an oxide material, a high-density plasma (HDP) oxide, or the like, formed by conventional methods known in the art.

The gate stacks 102 on the substrate 101 may comprise gate dielectrics 105, gate electrodes 107, and spacers 109. The gate dielectrics 105 may be a dielectric material, such as silicon oxide, silicon oxynitride, silicon nitride, an oxide, a nitrogen-containing oxide, a combination thereof, or the like. The gate dielectrics 105 may have a relative permittivity value greater than about 4. Other examples of such materials include aluminum oxide, lanthanum oxide, hafnium oxide, zirconium oxide, hafnium oxynitride, or combinations thereof.

In an embodiment in which the gate dielectrics 105 comprise an oxide layer, the gate dielectrics 105 may be formed by any oxidation process, such as a wet or dry thermal oxidation in an ambient comprising an oxide, $H_2O$, NO, or a combination thereof. Alternatively, the gate dielectrics 105 may be formed by chemical vapor deposition (CVD) techniques using tetra-ethyl-ortho-silicate (TEOS) and oxygen as a precursor. In an embodiment, the gate dielectrics 105 may be between about 8 Å to about 200 Å in thickness.

The gate electrodes 107 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof, or the like. In an embodiment in which the gate electrodes 107 are poly-silicon, the gate electrodes 107 may be formed by depositing doped or undoped poly-silicon by low-pressure chemical vapor deposition (LPCVD) to a thickness in the range of about 400 Å to about 2,400 Å, such as about 1,400 Å.

Once the gate dielectrics 105 and the gate electrodes 107 have been formed, the gate dielectrics 105 and gate electrodes 107 may be patterned. In an embodiment, the gate dielectrics 105 and the gate electrodes 107 may be patterned using, e.g., a photolithographic masking and etching process, whereby a photolithographic mask (not shown in FIG. 1) is formed over the gate electrodes 107 and then exposed to a patterned light. After exposure, desired portions of the photolithographic mask are removed to exposed the underlying gate electrodes 107, which may then be etched to remove the exposed portions, thereby patterning the gate electrodes 107 and the gate dielectrics 105.

The spacers 109 may be formed by blanket depositing one or more spacer layers (not shown) over the gate electrodes 107 and the substrate 101. The spacer layers may comprise SiN, oxynitride, SiC, SiON, oxide, and the like and may be formed by commonly used methods such as chemical vapor deposition (CVD), plasma enhanced CVD, sputter, and other methods known in the art. The spacer layers may be patterned, such as by isotropically or anisotropically etching, thereby removing the spacer layers from the horizontal surfaces of the structure and forming the spacers 109 as illustrated in FIG. 1.

Source/drain regions 111 may be formed in the substrate 101 on opposing sides of the gate dielectrics 105. In an embodiment in which the substrate 101 is an n-type substrate, the source/drain regions 111 may be formed by implanting appropriate p-type dopants such as boron, gallium, indium, or the like. Alternatively, in an embodiment in which the substrate 101 is a p-type substrate, the source/drain regions 111 may be formed by implanting appropriate n-type dopants such as phosphorous, arsenic, or the like. These source/drain regions 111 may be implanted using the gate dielectrics 105, gate electrodes 107, and the spacers 109 as masks.

The first ILD layer 113 may be formed over the gate stacks 102 and the substrate 101 in order to provide electrical isolation between the substrate 101, the gate stacks 102, and overlying metallization layers. The first ILD layer 113 may be formed by chemical vapor deposition, sputtering, or any other methods known and used in the art for forming an ILD, using, e.g., tetra-ethyl-ortho-silicate (TEOS) and oxygen as a precursor. The first ILD layer 113 may be about 4,000 Å to about 13,000 Å in thickness, but other thicknesses may be used. The first ILD layer 113 may comprise doped or undoped silicon oxide, although other materials such as silicon nitride doped silicate glass, high-k materials, combinations of these, or the like, may alternatively be utilized. After formation, the first ILD layer 113 may be planarized using, e.g., a chemical mechanical polish (CMP) process.

After the first ILD layer 113 layer has been formed, the capacitor contacts 115 and the lower bit line contact 117 may be formed through the first ILD layer 113. In an embodiment the capacitor contacts 115 may be formed to provide an electrical connection between the substrate 101 and the bottom capacitor plates 123 (described further below). The lower bit line contact 117 may be formed to help provide an electrical connection between the source/drain regions 111 between the gate stacks 102 and a bit line 407 (discussed below with respect to FIG. 4).

The capacitor contacts 115 and the lower bit line contact 117 may be formed through a damascene process, whereby masks are deposited onto the surface of the first ILD layer 113, holes are etched into the surface, and conductive material (such as tungsten or copper) is used to fill the holes. It should be noted that the capacitor contacts 115 and the lower bit line contact 117 may comprise one or more layers of conductive material. For example, the capacitor contacts 115 and the lower bit line contact 117 may include barrier layers, adhesive layers, multiple conductive layers, or the like.

The first etch stop layer 119 may be formed over the first ILD layer 113 in order to provide a control point for a subsequent etch process. The first etch stop layer 119 may be a dielectric material such as SiN or SiON, although other materials known in the art, such as SiC or oxide, could also be used. In an embodiment the first etch stop layer 119 may be formed using a process such as CVD, PECVD, ALD, or the like, and may be formed to have a thickness of between about 300 Å and about 1,500 Å.

The second ILD layer 121 may be formed over the first etch stop layer 119 and may comprise an oxide that may be formed either by chemical vapor deposition (CVD) techniques using tetra-ethyl-ortho-silicate (TEOS) and oxygen as a precursor, or else by plasma enhanced chemical vapor deposition (PECVD). In an embodiment, the second ILD layer 121 may be between about 4,000 Å and about 13,000 Å in thickness. The surface of the second ILD layer 121 may be planarized, such as by a CMP process using an oxide slurry.

Once the second ILD layer 121 has been formed, the second ILD layer 121 and the first etch stop layer 119 may be patterned in order to expose the underlying capacitor contacts 115 and to provide an opening in the second ILD layer 121 in which the bottom capacitor plates 123 may be formed. The second ILD layer 121 and the first etch stop layer 119 may be patterned using, e.g., a suitable photolithographic masking and etching process in which a photoresist (not shown in FIG. 1) is formed over the second ILD layer 121, irradiated, and developed so that underlying portions of the second ILD layer 121 are exposed. Once the photoresist has been developed, the exposed second ILD layer 121 may be removed using a suitable etchant and also using the photoresist as a mask. The etching of the second ILD layer 121 may be stopped on the first etch stop layer 119, and then the first etch stop layer 119 may be etched using the photoresist and the second ILD layer 121 as masks in order to expose the underlying capacitor contacts 115.

Once the second ILD layer 121 and the first etch stop layer 119 have been patterned, the bottom capacitor plates 123 may be formed in electrical contact with the capacitor contacts 115. The bottom capacitor plates 123 may be formed by depositing and patterning a layer of conductive material, such as TiN, TaN, ruthenium, or the like. The bottom capacitor plates 123 may be formed, for example, by CVD or ALD techniques and may be between about 100 Å to about 500 Å in thickness, such as about 200 Å in thickness. After the bottom capacitor plates 123 have been formed, any excess conductive material on the surface of the second ILD layer 121 may be removed by, for example, a CMP process or an etch back process.

Figure 2A:
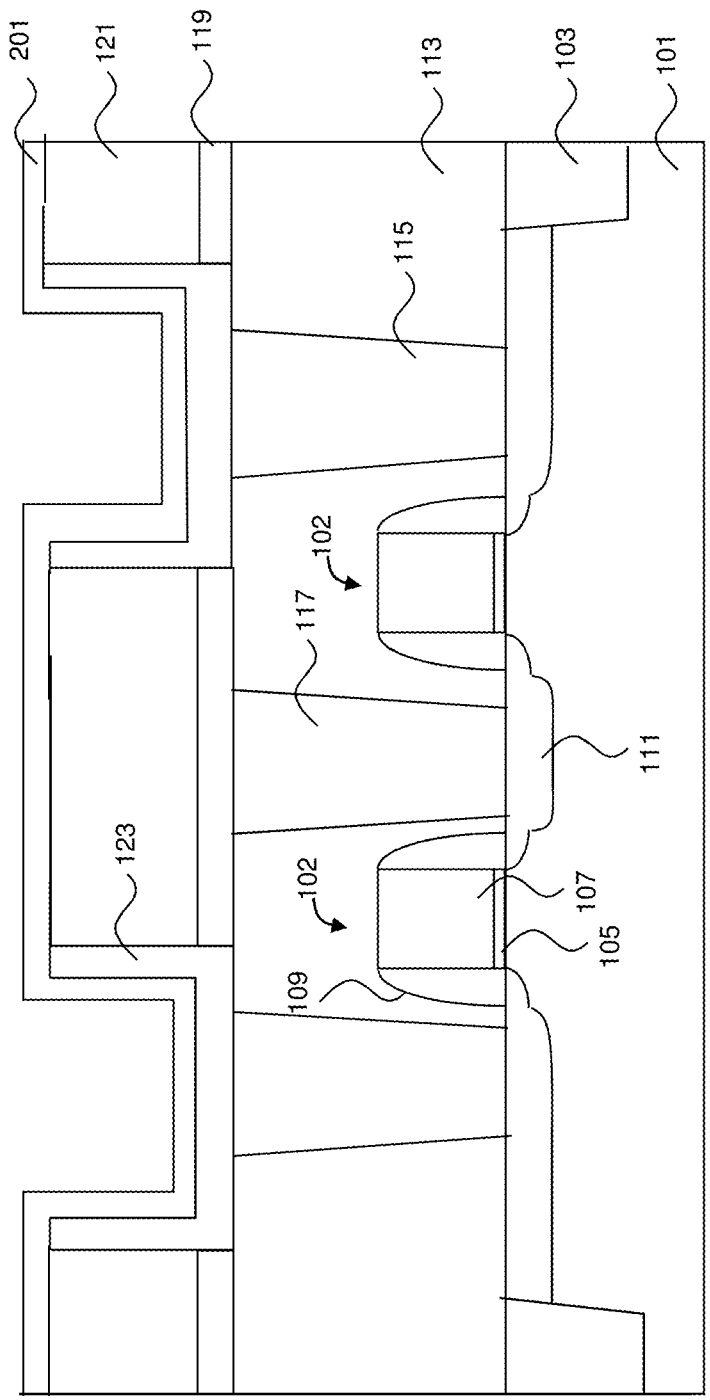
FIG. 2A illustrates the formation of a dielectric layer over the bottom capacitor electrodes in accordance with an embodiment.

FIG. 2A illustrates a deposited layer 201 that may be formed over the bottom capacitor plates 123. The deposited layer 201 may be utilized as a dielectric layer to electrically isolate the bottom capacitor plates 123 from the top capacitor plates 401 (not shown in FIG. 2A but illustrated and discussed below with respect to FIG. 4). In an embodiment the deposited layer 201 may be used in conjunction with the bottom capacitor plates 123 and the top capacitor plates 401 to form capacitors which may be used to store a charge in, e.g., an embedded dynamic random access memory (eDRAM) structure.

Figure 2B:
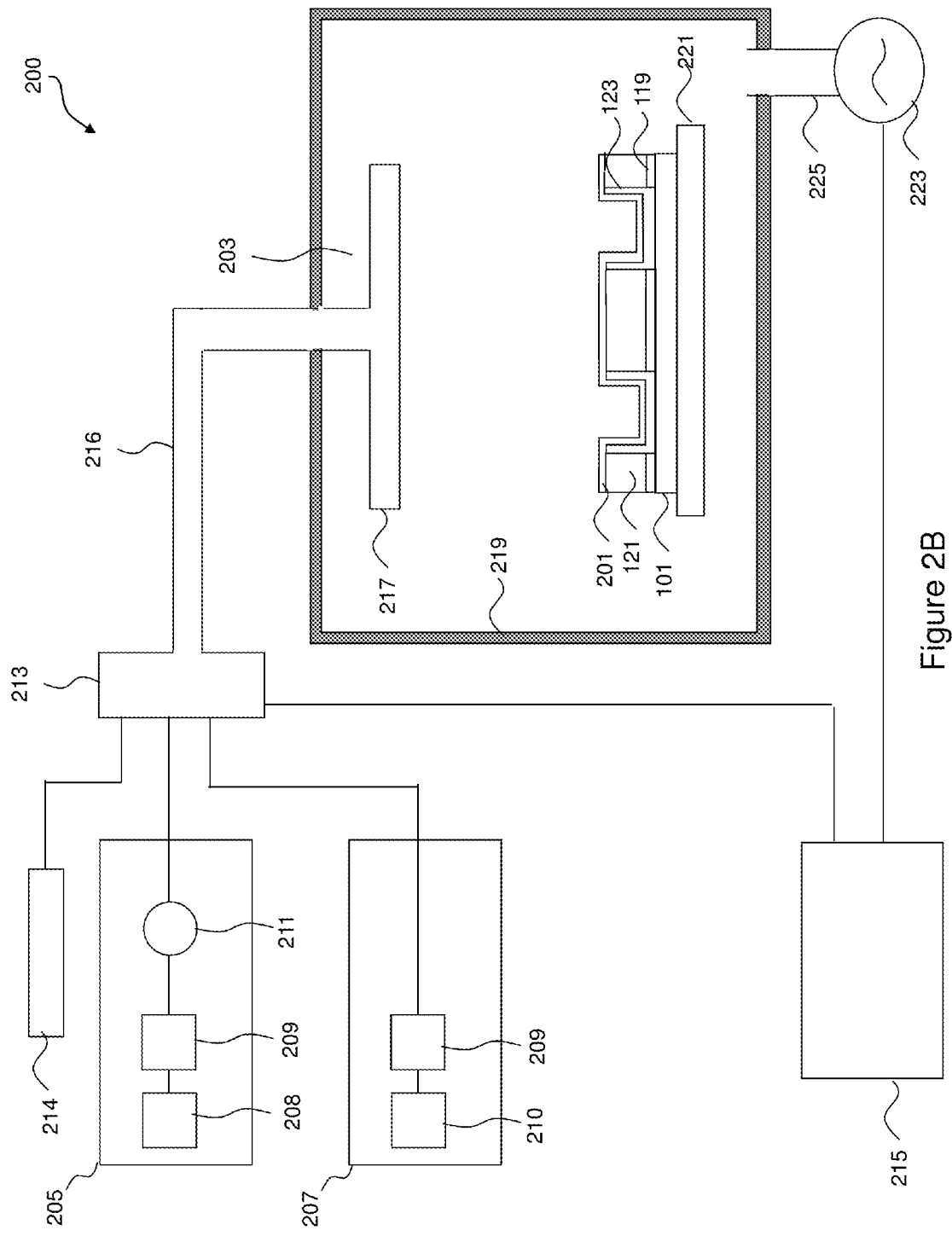
FIG. 2B illustrates a deposition chamber that may be used to form the dielectric layer in accordance with an embodiment.

FIG. 2B illustrates a deposition system 200 that may be utilized to form the deposited layer 201. In an embodiment the deposition system 200 may receive precursor materials from a first precursor delivery system 205 and a second precursor delivery system 207, and form the deposited layer 201 onto the second ILD layer 121 and the bottom capacitor plates 123 that are over the substrate 101 (with the intervening layers between the substrate 101 and the first etch stop layer 119 removed from FIG. 2B for clarity). The formation of the deposited layer 201 may be performed in a deposition chamber 203 which receives the first precursor material and the second precursor material.

The first precursor delivery system 205 and the second precursor delivery system 207 may work in conjunction with one another to supply the various different precursor materials to the deposition chamber 203. In an embodiment the first precursor delivery system 205 may include a carrier gas supply 208, a flow controller 209, and a precursor canister 211. The carrier gas supply 208 may supply a gas that may be used to help "carry" the precursor gas to the deposition chamber 203. The carrier gas may be an inert gas or other gas that does not react with the precursor material or other materials within the deposition system 200. For example, the carrier gas may be helium (He), argon (Ar), nitrogen ($N_2$), hydrogen ($H_2$), combinations of these, or the like, although any other suitable carrier gas may alternatively be utilized. The carrier gas supply 208 may be a vessel, such as a gas storage tank, that is located either locally to the deposition chamber 203 or else may be located remotely from the deposition chamber 203.

The carrier gas supply 208 may supply the desired carrier gas to the flow controller 209. The flow controller 209 may be utilized to control the flow of the carrier gas to the precursor canister 211 and, eventually, to the deposition chamber 203, thereby also helping to control the pressure within the deposition chamber 203. The flow controller 209 may be, e.g., a proportional valve, a modulating valve, a needle valve, a pressure regulator, a mass flow controller, combinations of these, or the like.

The flow controller 209 may supply the controlled carrier gas to the precursor canister 211. The precursor canister 211 may be utilized to supply a desired precursor to the deposition chamber 203 by vaporizing or sublimating precursor materials that may be delivered in either a solid or liquid phase. The precursor canister 211 may have a vapor region into which precursor material is driven into a gaseous phase so that the carrier gas from the flow controller 209 may enter the precursor canister 211 and pick-up or carry the gaseous precursor material out of the precursor canister 211 and towards the deposition chamber 203.

The second precursor delivery system 207 may comprise components similar to the first precursor delivery system 205 if the second precursor material may be implemented using a carrier gas and a sublimation/vaporization process. Alternatively, in an embodiment in which the second precursor material is in a gaseous state during preparation and storage, the second precursor delivery system 207 may comprise a second precursor material supplier 210, such as a gas storage tank or a machine to generate the second precursor material on an as-needed basis. For example, in an embodiment in which ozone is utilized as the second precursor material, the second precursor material supplier 210 may comprise a concentrator or other ozone generator that can generate ozone as needed in order to supply it to the precursor gas controller 213.

The second precursor material supplier 210 may supply a stream of the second precursor material to, e.g., a flow controller 209 similar to the flow controller described above with respect to the first precursor delivery system 205. The flow controller 209 in the second precursor delivery system 207 may help control the flow of the second precursor material to the precursor gas controller 213, and may be, e.g., a proportional valve, a modulating valve, a needle vale, a pressure regulator, a mass flow controller, a combination of these, or the like, although any other suitable method of controlling the flow of the second precursor material may alternatively be utilized.

The first precursor delivery system 205 and the second precursor delivery system 207 may supply their individual precursor materials into a precursor gas controller 213 which may connect and isolate the first precursor delivery system 205 and the second precursor delivery system 207 from the deposition chamber 203 in order to deliver the desired precursor material to the deposition chamber 203. The precursor gas controller 213 may include such devices as valves, flow meters, sensors, and the like to control the delivery rates of each of the precursors, and may be controlled by instructions received from the control unit 215.

The precursor gas controller 213, upon receiving instructions from a control unit 215, may open and close valves so as to connect one of the first precursor delivery system 205 and the second precursor delivery system 207 to the deposition chamber 203 and direct a desired precursor material through a manifold 216, into the deposition chamber 203, and to a showerhead 217. The showerhead 217 may be utilized to disperse the chosen precursor material into the deposition chamber 203 and may be designed to evenly disperse the precursor material in order to minimize undesired process conditions that may arise from uneven dispersal. In an embodiment the showerhead 217 may have a circular design with openings dispersed evenly around the showerhead 217 to allow for the dispersal of the desired precursor material into the deposition chamber 203.

The deposition chamber 203 may receive the desired precursor materials and expose the precursor materials to the substrate 101, and the deposition chamber 203 may be any desired shape that may be suitable for dispersing the precursor materials and contacting the precursor materials with the substrate 101. In the embodiment illustrated in FIG. 1, the deposition chamber 203 has a cylindrical sidewall and a bottom. Furthermore, the deposition chamber 203 may be surrounded by a housing 219 made of material that is inert to the various process materials. In an embodiment, the housing 219 may be steel, stainless steel, nickel, aluminum, alloys of these, or combinations of these.

Within the deposition chamber 203 the substrate 101 may be placed on a mounting platform 221 in order to position and control the substrate 101 during the deposition process. The mounting platform 221 may include heating mechanisms in order to heat the substrate 101 during the deposition process. Furthermore, while a single mounting platform 221 is illustrated in FIG. 2B, any number of mounting platforms 221 may additionally be included within the deposition chamber 203.

The deposition chamber 203 may also have an exhaust outlet 225 for exhaust gases to exit the deposition chamber 203. A vacuum pump 223 may be connected to the exhaust outlet 225 of the deposition chamber 203 in order to help evacuate the exhaust gases. The vacuum pump 223, under control of the control unit 215, may also be utilized to reduce and control the pressure within the deposition chamber 203 to a desired pressure and may also be utilized to evacuate precursor materials from the deposition chamber 203 in preparation for the introduction of the next precursor material.

The deposition system 200 may be utilized to form the deposited layer 201 onto the substrate 101. In an embodiment the deposited layer 201 may be a high-k dielectric layer of a material such as zirconium oxide ($ZrO_2$), hafnium oxide ($HfO_2$), lanthanum oxide ($La_2O_3$), or the like. The deposited layer 201 may be formed in the deposition chamber 203 utilizing a deposition process such as atomic layer deposition (ALD).

However, while the embodiment described herein describes utilizing ALD to form the deposited layer 201 as a dielectric layer within a capacitor, the embodiments are not intended to be limited to a capacitor dielectric, or even to a dielectric material at all, as other uses and materials, such as conductive materials, may be formed utilizing the embodiments. As examples only, ALD in microelectronics may be used to form high-k (high permittivity) gate oxides, high-k memory capacitor dielectrics (such as the deposited layer 201 illustrated in FIGS. 1-6B), ferroelectrics, and metals and nitrides for electrodes and interconnects. In high-k gate oxides, where a greater control of ultra-thin films may be desirable, ALD may come in to wider use at the 45 nm technology. In metallizations, conformal films are useful, and it is currently expected that ALD will be used in mainstream production at the 65 nm node. In dynamic random access memories (DRAMs), the usefulness of conformal layers is even greater and ALD can help to meet processing goals when feature sizes become smaller than 100 nm.

In an embodiment utilizing ALD to form a gate dielectric in a metal-oxide-semiconductor field-effect transistor (MOSFET), ALD may be utilized in the deposition of high-k oxides such as $Al_2O_3$, $ZrO_2$, and $HfO_2$. The motivation for high-k oxides comes from the problem of high tunneling currents through the currently used $SiO_2$ MOSFET gate dielectric when it is downscaled to a thickness of 1.0 nm and below. With the high-k oxide, a thicker gate dielectric can be made for the required capacitance density, thus the tunneling current can be reduced through the structure.

The development of dynamic random access memory (DRAM) capacitor dielectrics has been similar to that of gate dielectrics: $SiO_2$ has been widely used in the industry thus far, but it is likely to be phased out in the near future as the scale of devices are decreased. For enhanced operation, the capacitor dielectrics in downscaled DRAM capacitors generally have good conformality and permittivity values above 200. As such, while capacitor dielectrics may include materials similar to those for the MOSFET gate dielectrics (for example, $Al_2O_3$, $ZrO_2$, and $HfO_2$, as discussed above), the candidate materials for DRAM capacitor dielectrics may also include other materials different from those materials for the MOSFET gate dielectrics, such as $(Ba,Sr)TiO_3$. As such, the ALD process, which can help to meet the high conformality goals for DRAM capacitor dielectrics, is also useful in forming capacitor dielectrics (such as the capacitor dielectric embodiment discussed in FIG. 1-6B) for DRAM applications.

In yet another example, ALD processes may be used to form transition-metal nitrides, such as TiN, WN, and TaN, which find potential use both as metal barriers and as gate metals. Metal barriers may be used in copper-based chips to avoid diffusion of copper into the surrounding materials, such as insulators and the silicon substrate and also to prevent copper contamination by elements diffusing from the insulators that surround the copper interconnection with a layer of metal barriers. The metal barriers are generally desired to be pure, dense, conductive, conformal, thin, and have good adhesion towards metals and insulators. These attributes, from a processing technique standpoint, may be fulfilled by embodiments utilizing ALD. In an embodiment, titanium nitride is one such ALD nitride that may be formed using an ALD process with the precursors $TiCl_4$ and $NH_3$.

The ALD process may also be utilized to form other metal films. As examples, in embodiments in which the deposited layer 201 is used as a conductive layer, the deposited layer 201 may form metal interconnects (e.g., copper), metal plugs (e.g., tungsten plugs), DRAM capacitor electrodes, ferroelectric random access memory (FRAM) electrodes (e.g., noble metals), and even high- and low-work function metals for dual-gate MOSFETs.

Given all of this, while the embodiments described herein may be utilized to form the deposited layer 201 as a capacitor dielectric as discussed in the embodiment illustrated in FIGS. 1-6B, the deposited layer 201 is not intended to be limited to a capacitor dielectric or even limited to a dielectric material at all. As discussed in the above paragraphs, the deposited layer 201 may be formed to be any other suitable dielectric layer, including a gate oxide for a MOSFET or any other usage for a dielectric material. Alternatively, the deposited layer 201 may be formed as a conductive material and used to form a gate metal or a barrier metal within a conductive interconnect. These and all other suitable uses for the deposited layer 201 and the ALD process may alternatively be utilized, and all are fully intended to be included within the scope of the embodiments.

Returning to the embodiment in which the deposited layer 201 is a capacitor dielectric, the formation of the deposited layer 201 may be initiated by putting a first precursor into the first precursor delivery system 205. For example, in an embodiment in which the deposited layer 201 is $ZrO_2$, the first precursor material may be a precursor such as tetrakis [ethylmethylamino]zirconium (TEMAZr). Alternatively, any suitable precursor material in any suitable phase (solid, liquid, or gas) to form a layer of $ZrO_2$, such as zirconium chloride ($ZrCl_4$), ZyALD, or Zr—PAZ may be utilized.

Additionally, a second precursor material may be placed into or formed by the second precursor delivery system 207. In the embodiment in which a layer of $ZrO_2$ is desired for the deposited layer 201, the second precursor material may contain oxygen in order to oxidize the first precursor material to form a monolayer of $ZrO_2$. For example, in the embodiment in which TEMAZr is utilized as the first precursor material, ozone ($O_3$) may be used as the second precursor material and may be placed into the second precursor delivery system 207. Alternatively, any other suitable precursor material, such as oxygen, water ($H_2O$), $N_2O$, $H_2O—H_2O_2$, or combinations of these, may be utilized as the second precursor material.

Once the first precursor material and the second precursor material are ready in the first precursor delivery system 205 and the second precursor delivery system 207, respectively, the formation of the deposited layer 201 may be initiated by the control unit 215 sending an instruction to the precursor gas controller 213 to connect the first precursor delivery system 205 to the deposition chamber 203. Once connected, the first precursor delivery system 205 can deliver the first precursor material (e.g., TEMAZr) to the showerhead 217 through the precursor gas controller 213 and the manifold 216. The showerhead 217 can then disperse the first precursor material into the deposition chamber 203, wherein the first precursor material can be adsorbed and react to the exposed surface of the second ILD layer 121 and the bottom capacitor plates 123.

In the embodiment in which the deposited layer 201 is $ZrO_2$, the first precursor material may be flowed into the deposition chamber 203 at a flow rate of between about 150 sccm and about 600 sccm, such as about 200 sccm for a first time $t_1$ of about 2 seconds per cycle. Additionally, the deposition chamber 203 may be held at a pressure of between about 1 Torr and about 10 Torr, such as about 3 Torr, and a temperature of between about 250° C. and about 400° C., such as about 300° C. However, as one of ordinary skill in the art will recognize, these process conditions are only intended to be illustrative, as any suitable process conditions may be utilized while remaining within the scope of the embodiments.

As the first precursor material is adsorbed onto the second ILD layer 121 and the bottom capacitor plates 123, the first precursor material will react with open active sites located on the exposed surfaces of the second ILD layer 121 and the bottom capacitor plates 123. However, once all of the open active sites on the second ILD layer 121 and the bottom capacitor plates 123 have reacted with the first precursor material, the reaction will stop, as there are no more open active sites to which the first precursor material will bond. This limitation causes the reaction of the first precursor material with the second ILD layer 121 and the bottom capacitor plates 123 to be self-limiting and to form a monolayer of the reacted first precursor material on the surface of the second ILD layer 121 and the bottom capacitor plates 123, thereby allowing for a precise control of the thickness of the deposited layer 201.

After the self-limiting reaction on the second ILD layer 121 and the bottom capacitor plates 123 has finished, the deposition chamber 203 may be purged of the first precursor material. For example, the control unit 215 may instruct the precursor gas controller 213 to disconnect the first precursor delivery system 205 (containing the first precursor material to be purged from the deposition chamber 203) and to connect a purge gas delivery system 214 to deliver a purge gas to the deposition chamber 203. In an embodiment the purge gas delivery system 214 may be a gaseous tank or other facility that provides a purge gas such as argon, nitrogen, xenon, or other non-reactive gas to the deposition chamber 203. Additionally, the control unit 215 may also initiate the vacuum pump 223 in order to apply a pressure differential to the deposition chamber 203 to aid in the removal of the first precursor material.

The purge gas, along with the vacuum pump 223, may purge the first precursor material from the deposition chamber 203 for a second time $t_2$ that is greater than the first time $t_1$. In an embodiment, the second time $t_2$ may be between about 2 seconds and about 12 seconds, such as about 10 seconds. By utilizing a longer purge time, a larger amount of residual organometallic chemicals (e.g., the first precursor and its elements such as carbon, nitrogen, and hydrogen) may be removed from the deposition chamber 203. As such, there will be less organometallic chemicals that may contaminate the deposited layer 201, and contamination may be reduced.

After the purge of the first precursor material has been completed, the introduction of the second precursor material (e.g., ozone) to the deposition chamber 203 may be initiated by the control unit 215 sending an instruction to the precursor gas controller 213 to disconnect the purge gas delivery system 214 and to connect the second precursor delivery system 207 (supplying the second precursor material) to the deposition chamber 203. Once connected, the second precursor delivery system 207 can deliver the second precursor material to the showerhead 217. The showerhead 217 can then disperse the second precursor material into the deposition chamber 203, wherein the second precursor material can react with the first precursor material in another self-limiting reaction to form a monolayer of the desired material, e.g., $ZrO_2$, on the surface of the second ILD layer 121 and the bottom capacitor plates 123.

In the embodiment discussed above to form a layer of $ZrO_2$ with ozone, the ozone may be introduced into the deposition chamber 203 at a flow rate of between about 500 sccm and about 900 sccm, such as about 700 sccm, while the deposition chamber 203 is held at a pressure of between about 1 Torr and about 10 Torr and a temperature of between about 250° C. and about 400° C. However, as one of ordinary skill in the art will recognize, these process conditions are only intended to be illustrative, as any suitable process conditions may be utilized to introduce oxygen while remaining within the scope of the embodiments.

Additionally, the second precursor material may be introduced into the deposition chamber 203 for a third time $t_3$ which is greater than or equal to the first time $t_1$. In an embodiment in which the second precursor material is an oxidizing agent such as ozone, having the third time $t_3$ being greater than the first time $t_1$ helps to complete the oxidation of the first precursor material. In at least one embodiment, the third time $t_3$ may be greater than or equal to the first time $t_1$, such as between about 2 seconds and about 5 seconds, such as 4 seconds.

After the monolayer of the desired material, e.g., $ZrO_2$, has been formed, the deposition chamber 203 may again be purged (leaving behind the monolayer of the desired material on the substrate 101). For example, the control unit 215 may instruct the precursor gas controller 213 to disconnect the second precursor delivery system 207 (containing the second precursor material to be purged from the deposition chamber 203) and to connect the purge gas delivery system 214 to deliver the purge gas to the deposition chamber 203. Additionally, the control unit 215 may also initiate the vacuum pump 223 in order to apply a pressure differential to the deposition chamber 203 to aid in the removal of the second precursor material.

The purge gas, along with the vacuum pump 223, may purge the second precursor material from the deposition chamber 203 for a fourth time $t_4$ that is greater than the third time $t_3$. In an embodiment, the fourth time $t_4$ may be between about 2 seconds and about 12 seconds, such as about 10 seconds. By utilizing a longer purge time, a larger amount of residual chemicals (e.g., the second precursor and any other chemicals that may have formed in side reactions) may be removed from the deposition chamber 203. Additionally, in an embodiment the total purge time (e.g., the sum of the second time $t_2$ and the fourth time $t_4$) may be larger than the total time of the precursor materials (e.g., the first time $t_1$ and the third time $t_3$). As such, there will be less residual chemical contamination that may contaminate the deposited layer 201, and contamination may be reduced.

After the deposition chamber 203 has been purged of the second precursor material, a first cycle for the formation of the desired material has been completed, and a second cycle similar to the first cycle may be started. For example, the repeated cycle may introduce the first precursor material for about 2 seconds, purge with the purge gas for about 10 seconds, pulse with the second precursor for about 4 seconds, and purge with the purge gas for about 10 seconds. These cycles may be repeated until the deposited layer 201 on the substrate 101 has a thickness of between about 65 Å and about 105 Å, such as about 85 Å. In an embodiment the desired thickness may be obtained with between about 70 cycles and about 120 cycles. Once the desired thickness of the deposited layer 201 has been reached, the substrate 101 may be removed from the deposition chamber 203 for further processing.

Figure 3:
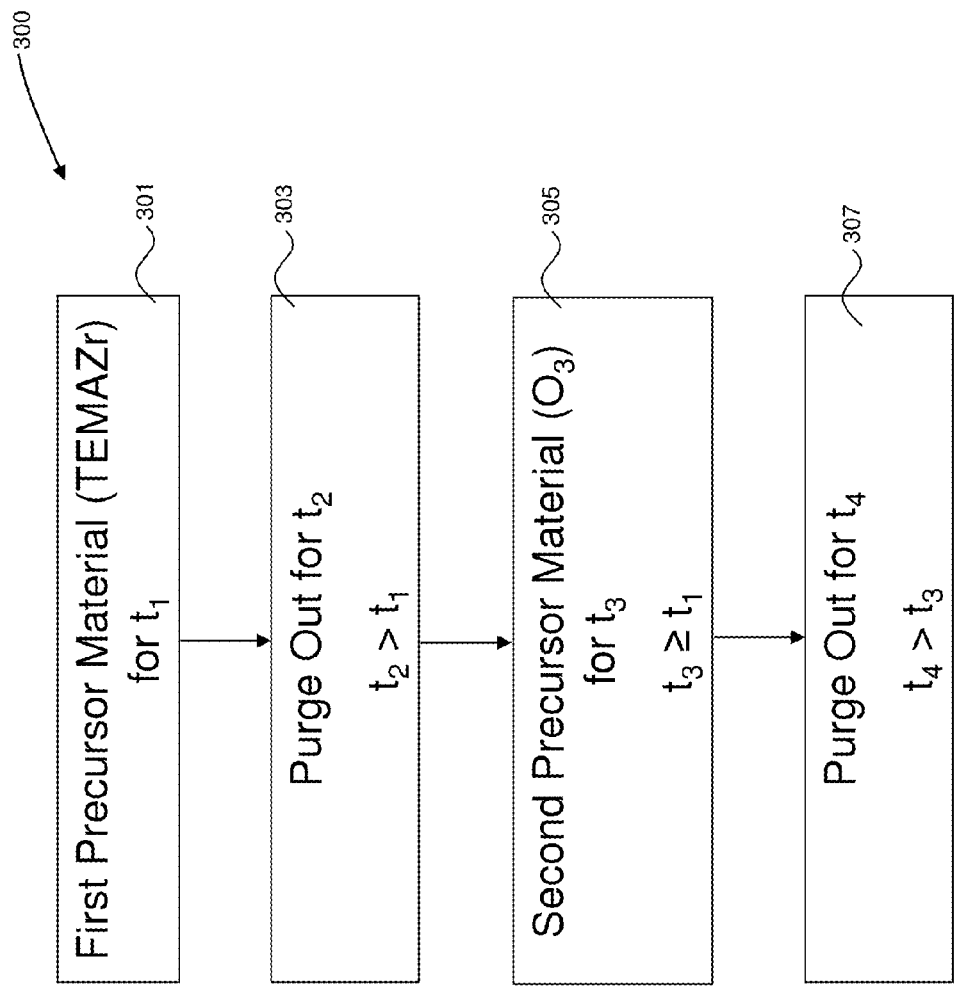
FIG. 3 illustrates a first deposition process that may be used to form the dielectric layer in accordance with an embodiment.

FIG. 3 illustrates a summary of the first deposition process 300 described to form the deposited layer 201. In an embodiment, the first deposition process 300 utilizes a cycle in which the first precursor material is introduced for the first time $t_1$ in a first step 301 and the deposition system 200 is purged for a second time $t_2$ in a second step 303, wherein the second time is greater than the first time $t_1$. The second precursor material is introduced for the third time $t_3$ in third step 305, wherein the third time is greater than or equal to the first time $t_1$. The deposition system 200 is then purged for the fourth time $t_4$ in a fourth step 307, wherein the fourth time is greater than the third time $t_3$.

Figure 4:
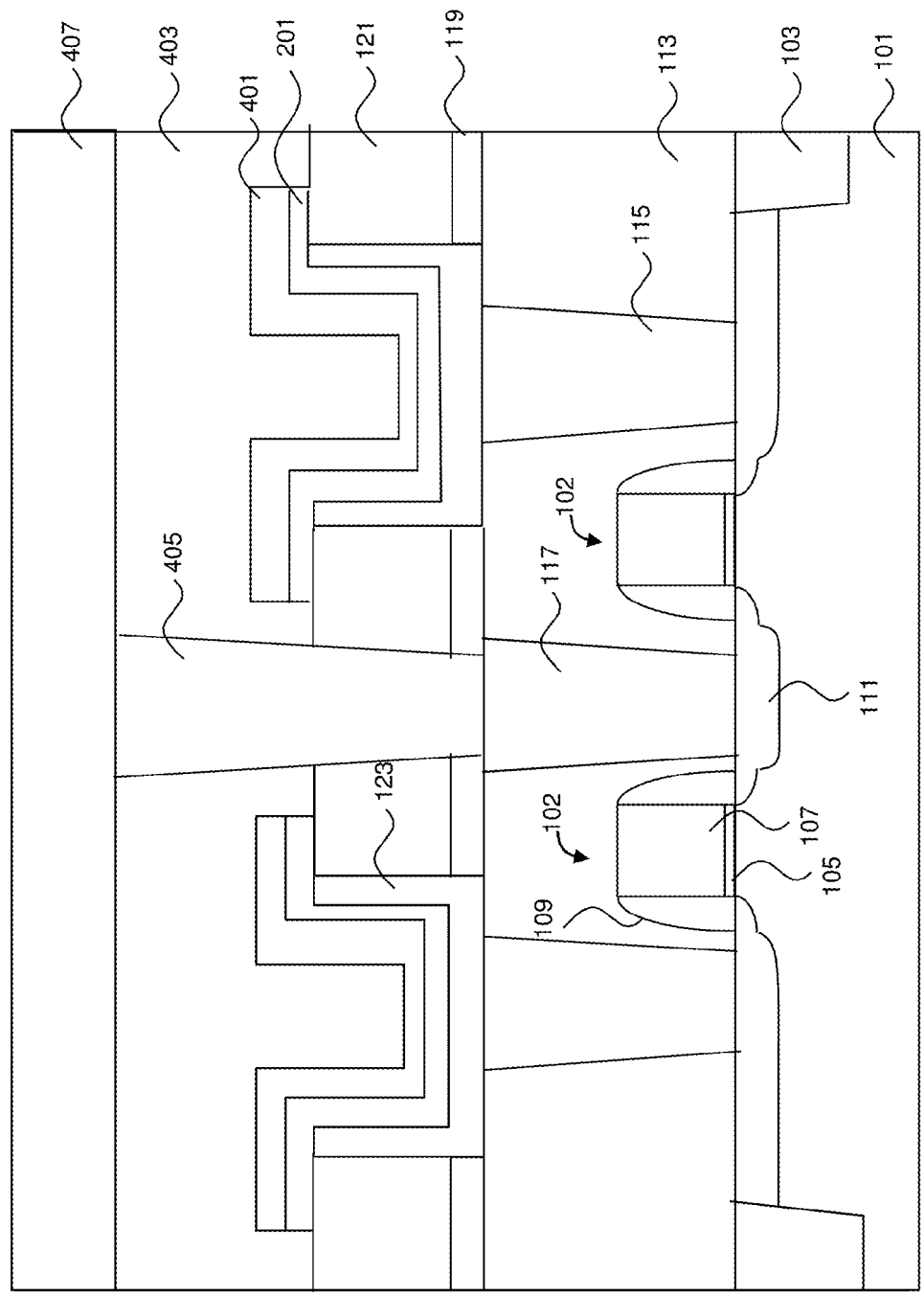
FIG. 4 illustrates the formation of a top capacitor electrode and a bit line over the dielectric layer in accordance with an embodiment.

FIG. 4 illustrates the formation of top capacitor plates 401 and the patterning of the top capacitor plates 401 and the deposited layer 201. The top capacitor plates 401 may be formed of a conductive material such as TiN, TaN, ruthenium, aluminum, tungsten, copper, combinations of these, or the like, and may be formed using a process such as CVD, PECVD, ALD, or the like. In an embodiment, the top capacitor plates 401 may be formed to a thickness of between about 100 Å and about 500 Å.

Once the top capacitor plates 401 have been formed, the top capacitor plates 401 and the deposited layer 201 may be patterned to form capacitors. In an embodiment the top capacitor plates 401 and the deposited layer 201 may be patterned using, e.g., a suitable photolithographic masking and etching process in which a photoresist (not shown in FIG. 4) is formed over the top capacitor plates 401, irradiated, and developed so that underlying portions of the top capacitor plates 401 are exposed. Once the photoresist has been developed, the exposed top capacitor plates 401 and the underlying deposited layer 201 may be removed using a suitable etchant and also using the photoresist as a mask.

FIG. 4 also illustrates the formation of a third ILD layer 403, an upper bit line contact 405, and a bit line 407. The third ILD layer 403 may comprise an oxide that may be formed by chemical vapor deposition (CVD) techniques using tetra-ethyl-ortho-silicate (TEOS) and oxygen as a precursor. However, other methods and materials known in the art may be used. In an embodiment the third ILD layer 403 may be between about 4,000 Å and about 13,000 Å in thickness, although other thicknesses may be used. The surface of the third ILD layer 403 may be planarized, such as by a CMP process using an oxide slurry.

After the third ILD layer 403 has been formed, the upper bit line contact 405 may be formed to extend through the third ILD layer 403 and the first etch stop layer 119. The upper bit line contact 405 may be formed using a damascene process, whereby masks are deposited onto the surface of the third ILD layer 403, openings are etched into the surface, and conductive material (such as tungsten or copper) is used to fill the openings. However, other methods and materials that are known in the art could also be used to form the upper bit line contact 405. It should be noted that the upper bit line contact 405 may comprise one or more layers of conductive material. For example, the upper bit line contact 405 may include barrier layers, adhesive layers, multiple conductive layers, or the like.

The bit line 407 may be electrically coupled with the upper bit line contact 405 to connect to the source/drain regions 111 in the substrate 101. The bit line 407 may be formed by a damascene process, whereby masks are deposited onto the surface of the third ILD layer 403, a pattern is etched into the surface, and conductive material is used to fill the pattern. Other methods or materials that are known in the art could also be used to form this bit line 407.

Figures 5A, 5B:
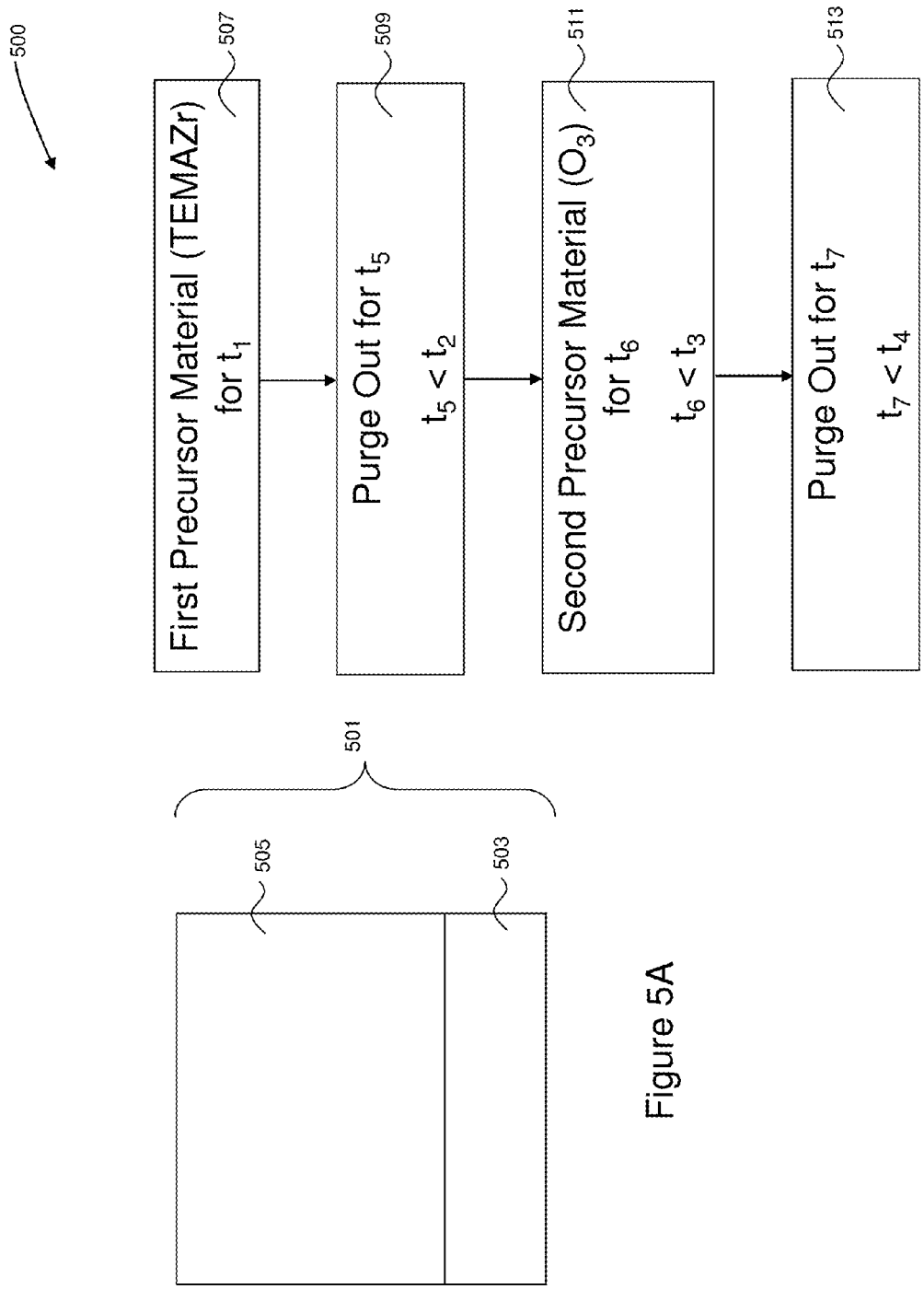
FIG. 5A illustrates a composite dielectric layer in accordance with an embodiment.
FIG. 5B illustrates a second deposition process that may be used to help form the composite dielectric layer in accordance with an embodiment.

FIGS. 5A-5B illustrate a composite dielectric layer 501 which may be formed with the first deposition process 300 (as discussed above with respect to FIG. 3) along with a second deposition process 500. This embodiment, while still applicable to capacitors in the 28 nanometer process node, may also be utilized to increase data retention of capacitors in eDRAM in the 40 nm process node as well. In this embodiment the first deposition process 300 may be utilized in conjunction with the second deposition process 500 to form the composite dielectric layer 501. In these embodiments the second deposition process 500 may utilize a faster cycle time than the first deposition process 300 in order to make the overall formation of the composite dielectric layer 501 more efficient in time than the formation of the deposited layer 201 using, e.g., the first deposition process 300 by itself.

For example, looking at FIG. 5A, the composite dielectric layer 501 may comprise a composite structure of a first dielectric material 503 and a second dielectric material 505. The first dielectric material 503 may be formed utilizing the first deposition process 300 described above with respect to FIGS. 2-3. However, in order to save time in the overall manufacture, the second dielectric material 505 may be formed using the second deposition process 500, summarized in FIG. 5B.

In this embodiment the second deposition process 500 may introduce the first precursor material for the first time $t_1$ in a fifth step 507. The deposition system 200 may then be purged for a fifth time $t_5$, wherein the fifth time is less than the second time $t_2$ in a sixth step 509. The second precursor material may then be introduced to the deposition system 200 for a sixth time $t_6$ in a seventh step 511, wherein the sixth time is less than the third time $t_3$, and the deposition system 200 may then again be purged for a seventh time $t_7$ in an eight step 513, wherein the seventh time $t_7$ is less than the fourth time $t_4$.

By utilizing a shorter time period for the purging and second precursor material than the first deposition process 300, the cycle time of the second deposition process 500 may be reduced, thereby reducing the overall deposition process for the composite dielectric layer 501 and making the overall deposition process less time consuming and more efficient. In a particular embodiment, the first time $t_1$, the fifth time $t_5$, the sixth time $t_6$, and the seventh time $t_7$ may all be the same time, such as 2 seconds. However, the fifth time $t_5$, the sixth time $t_6$, and the seventh time $t_7$ are not intended to be limited to being the same time as each other, as other time periods may alternatively be utilized.

Accordingly, by utilizing both the first deposition process 300 and the second deposition process 500, the first dielectric material 503 may be initially formed to help lower the leakage of the composite dielectric layer 501 while the second dielectric material 505 may be utilized to make the overall deposition process more efficient. Additionally, by utilizing the first deposition process 300 and the second deposition process 500, the first dielectric material 503 will have a higher oxygen content from the increased oxidation time than the second dielectric material 505. In a particular embodiment the first dielectric material 503 (formed using the first deposition process 300) may be formed to a thickness of between about 25 Å and about 35 Å, while the second dielectric material 505 (formed using the second deposition process 500) may be formed to a thickness of between about 50 Å and about 70 Å. The first dielectric material 503 is thinner than the second dielectric material 505. With these thicknesses, the composite dielectric layer 501 may obtain a faster throughput (in wafers per hour) of between about 1 pcs/hr and about 2 pcs/hr, while also achieving a reduction in the leakage.

Figure 6B:
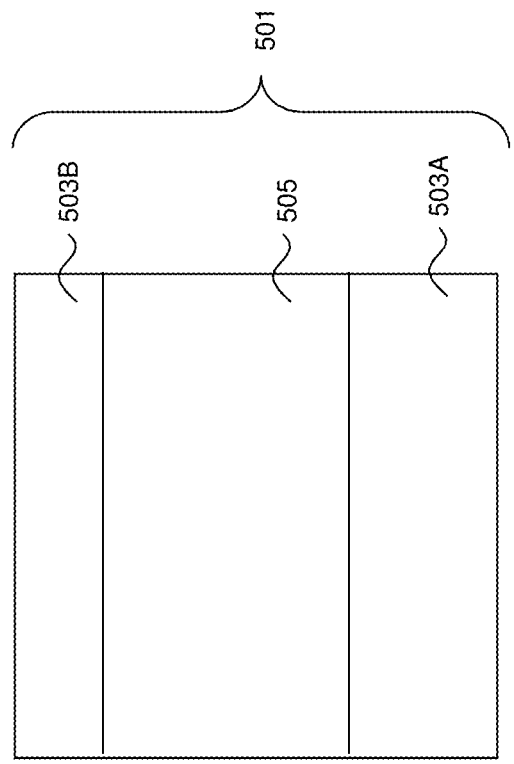
FIGS. 6A-6B illustrate composite dielectric layers in accordance with an embodiment.
Figure 6A:
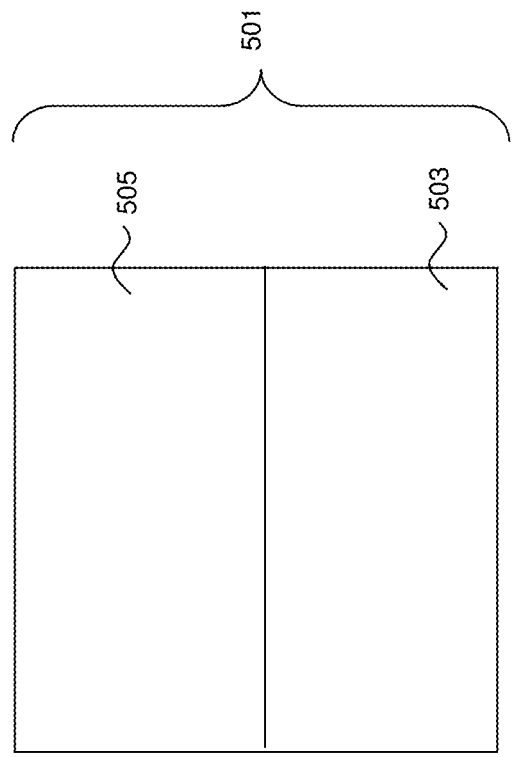

FIGS. 6A-6B illustrate additional embodiments of the composite dielectric layer 501. In FIG. 6A the first dielectric material 503 may be formed (using the first deposition process 300) to a thickness of between about 45 Å and about 50 Å. The second dielectric material 505 may be formed (using the second deposition process 500) to a thickness of between about 45 Å and about 50 Å. The first dielectric material 503 and the second dielectric material 505 may have substantially the same thicknesses. This process may obtain a higher throughput, such as about 1.5 pcs/hr, than using the first deposition process 300 by itself (although not as high as the embodiment described above with respect to FIG. 5A), while still obtaining a greater reduction in leakage than the embodiment described above with respect to FIG. 5A.

FIG. 6B illustrates an embodiment of the composite dielectric layer 501 in which the first dielectric materials 503A and 503B may be formed on both sides of the second dielectric material 505. The first dielectric materials 503A and 503B may be thinner than the second dielectric material 505. In this embodiment the first dielectric material 503A may be formed (using, e.g., the first deposition process 300) to a thickness of between about 27 Å and about 37 Å, such as about 32 Å, and the second dielectric material 505 may be formed (using the second deposition process 500) to a thickness of between about 45 Å and about 50 Å, such as about 47 Å. Additionally, once the second dielectric material 505 has been formed, another layer of the first dielectric material 503B may be formed over the second dielectric material 505. In an embodiment the additional layer of the first dielectric material 503B may be formed to have at thickness of between about 14 Å and about 18 Å, such as about 16 Å. This embodiment may obtain a greater reduction in leakage than the embodiment described above with respect to FIG. 6A, but also may have a lower throughput (in wafers per hour), such as about 1 pcs/hr.

Additionally, as one of ordinary skill in the art will recognize, the embodiments described above with respect to the composite dielectric layer are intended to be only illustrative examples of the composite dielectric layer, and are not intended to limit the embodiments in any fashion. Any other suitable combination of the first dielectric material 503 and the second dielectric material 505 may be utilized, such as by first forming the second dielectric material 505 and then forming the first dielectric material 503 over the second dielectric material 505. These and any other suitable combinations may alternatively be utilized and are fully intended to be included within the scope of the embodiments.

Figure 7A:
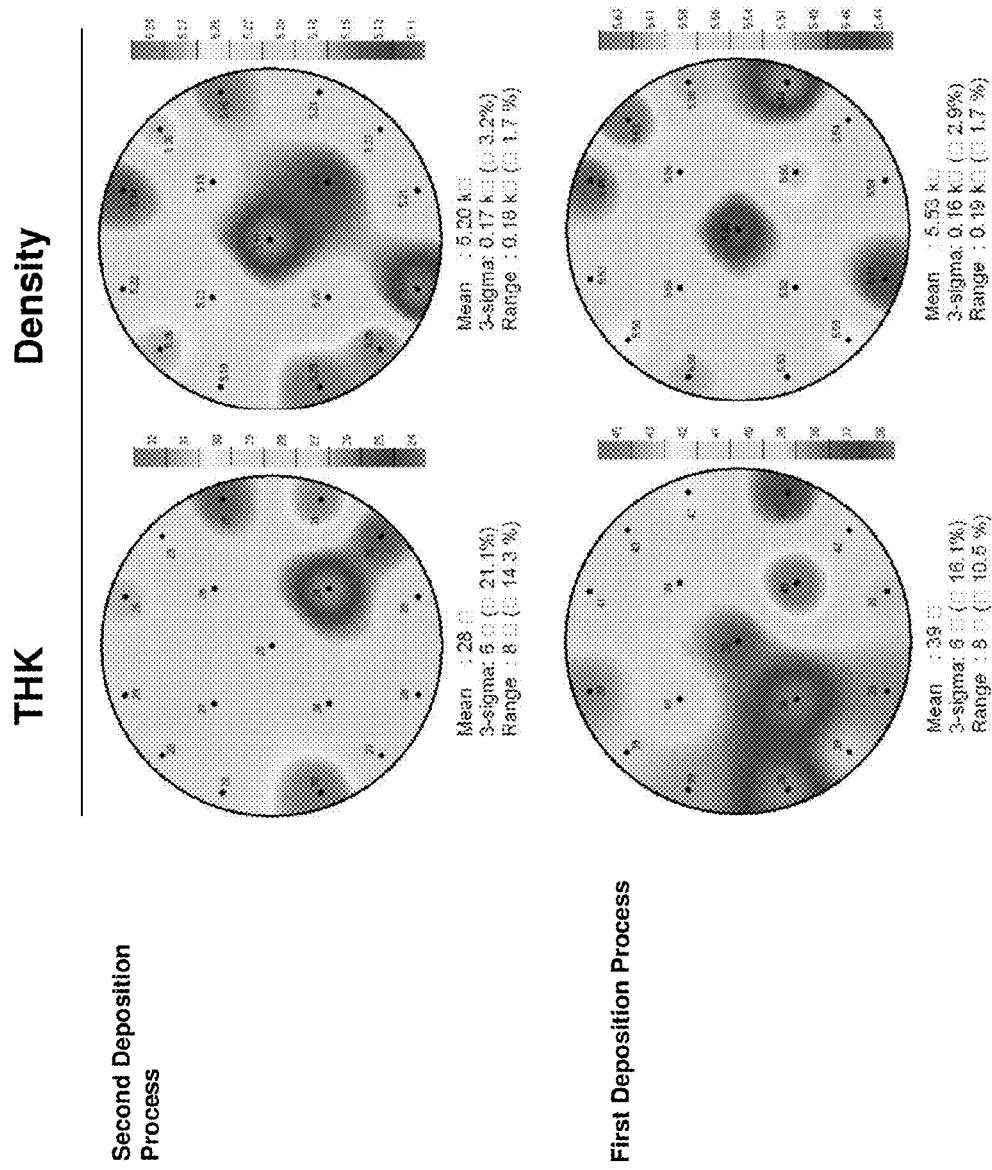
FIGS. 7A-7B illustrate test data showing an increase in density in accordance with an embodiment.
Figure 7B:
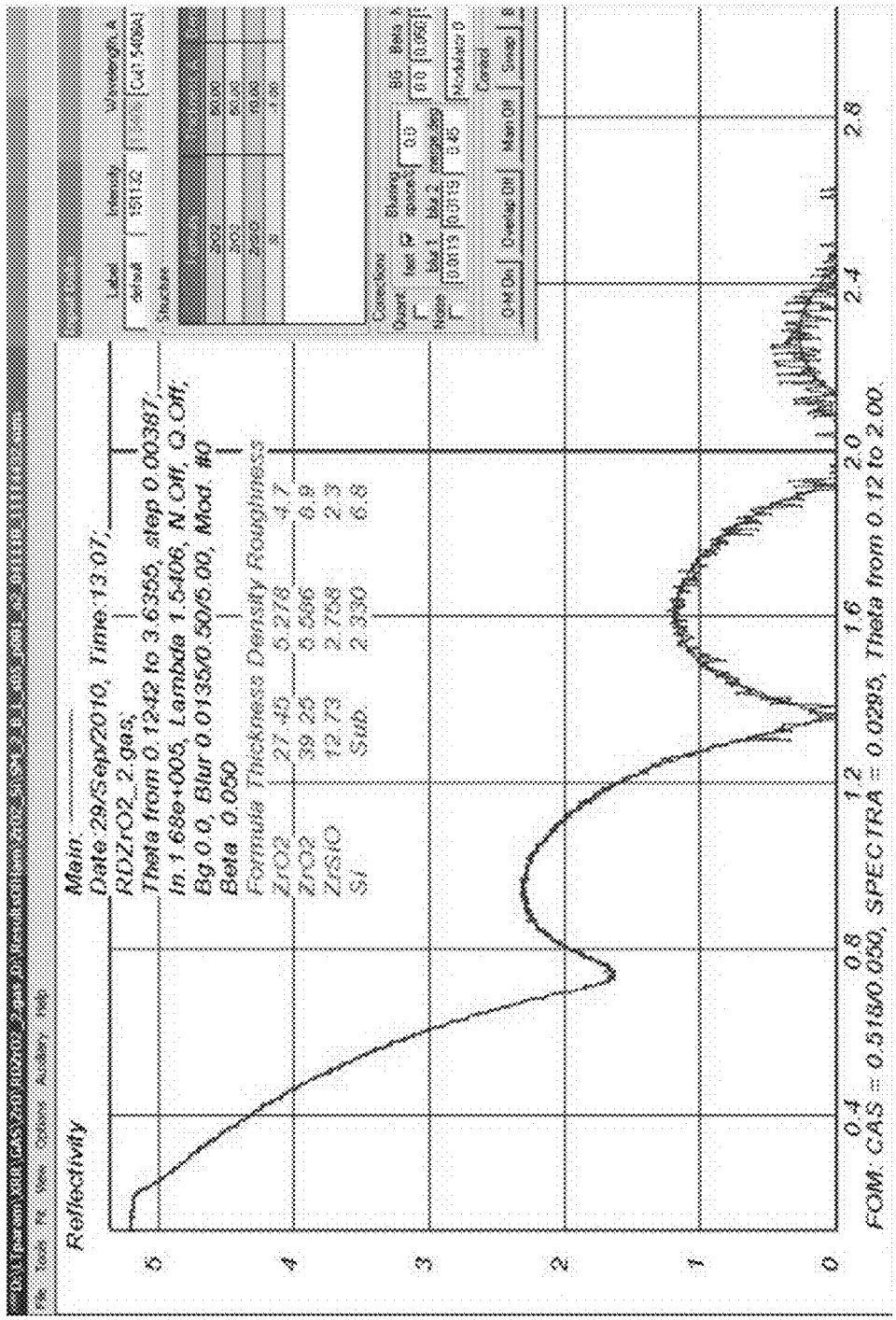

FIGS. 7A-7B illustrate that, by utilizing the first deposition process 300 (as described above with respect to FIG. 3), the density and defect count of the deposited layer 201 may be better controlled. Looking at FIG. 7A, a dielectric formed using the first deposition process 300 has a measured mean density of 5.53 k, which is larger than the mean measured density of a dielectric formed using the second deposition process 500, which has a mean measured density of 5.2 k. This increased density indicates a lower defect count in the dielectric formed using the first deposition process 300.

FIG. 7B illustrates a similar test result of increased density using an XRR Fitting model wherein the spectrum is collected from 0.12 to 2 degrees. Looking at a layer of zirconium oxide formed from the second deposition process 500 and having a thickness of 27.45 Å, the layer of zirconium oxide formed from the second deposition process 500 has a measured density of 5.278. However, a layer of zirconium oxide formed using the first deposition process 300 and having a thickness of 39.25 Å has a measured density of 5.586. As such, while it would normally be expected that a dielectric layer such as zirconium oxide would have the same density, using the first deposition process 300 results in an increase in the density of the deposited layer 201 as compared to other methods of formation such as the second deposition process 500.

Figure 8:
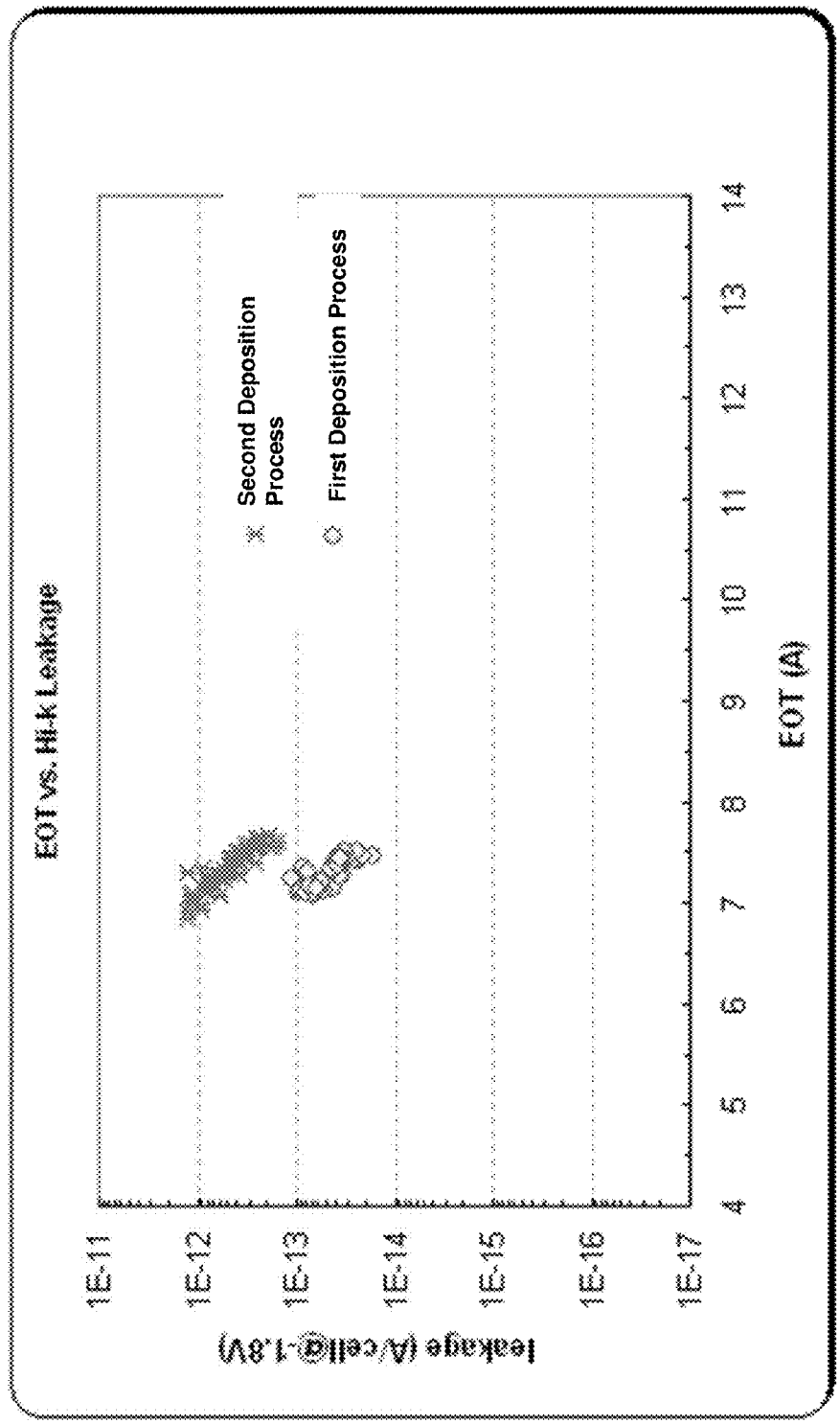
FIG. 8 illustrates test data showing a reduction in leakage in accordance with an embodiment.

FIG. 8 illustrates that, with the improvements in the density and defect count illustrated above in FIGS. 7A-7B, the leakage of the deposited layer 201 when it is a dielectric material may also be improved. In this chart the equivalent oxide thickness (EOT), in Angstroms, is located along the x-axis while the leakage of capacitors utilizing the deposited layer 201 at −1.8 volts is located along the y-axis. As illustrated there is an unexpected improvement of about one order of leakage improvement when the first deposition process 300 is utilized instead of the second deposition process 500.

Figure 9:
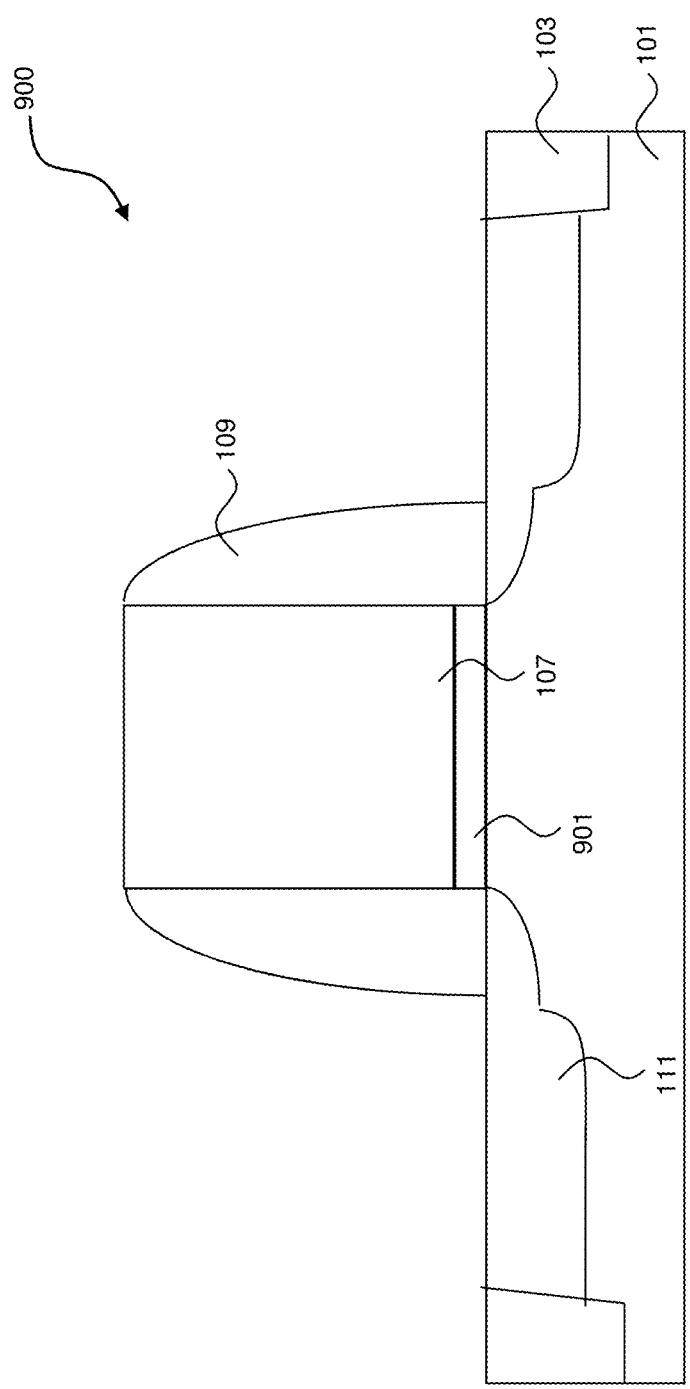
FIG. 9 illustrates the dielectric layer being utilized as a gate dielectric in a CMOS transistor in accordance with an embodiment.

FIG. 9 illustrates another embodiment in which the first deposition process 300 may be utilized to form a second gate dielectric 901 for a high-k metal gate transistor 900. In this embodiment the high-k metal gate transistor 900 may be formed, e.g., on the substrate 101, and isolation regions 103 may be formed within the substrate 101 as described above with respect to FIG. 1.

In this embodiment, however, the second gate dielectric 901 may be formed using the first deposition process 300 as described above with respect to FIGS. 2-3. For example, the first precursor material may be introduced for the first time $t_1$, a purge may be performed for the second time $t_2$, the second precursor material may be introduced for the third time $t_3$, and the purge may be performed for the fourth time $t_4$. This cycle may be repeated to form the second gate dielectric 901 to a thickness of between about 5 Å and about 20 Å, and the second gate dielectric 901 of, e.g., $ZrO_2$, may be formed with a lower leakage, a higher density, and fewer defects.

Alternatively, the second gate dielectric 901 may be formed using a composite dielectric of material formed using a combination of the first deposition process 300 and the second deposition process 700, as described above with respect to FIGS. 5A-6B. For example, the second gate dielectric 901 may be formed using the first dielectric material 503 having a thickness of about 32 Å and the second dielectric material 505 having a thickness of about 63 Å, although any suitable combination of the first dielectric material 503 and the second dielectric material 505 may alternatively be utilized.

Once the second gate dielectric 901 has been formed, the gate electrodes 107, the spacers 109 and the source/drain regions 111 may be formed as described above with respect to FIG. 1. However, by utilizing the first deposition process 300 (either by itself or in conjunction with the second deposition process 700), the high-k metal gate transistor 900 with the second gate dielectric 901 may be formed with a lower leakage, a higher density, and fewer defects.

Figure 10:
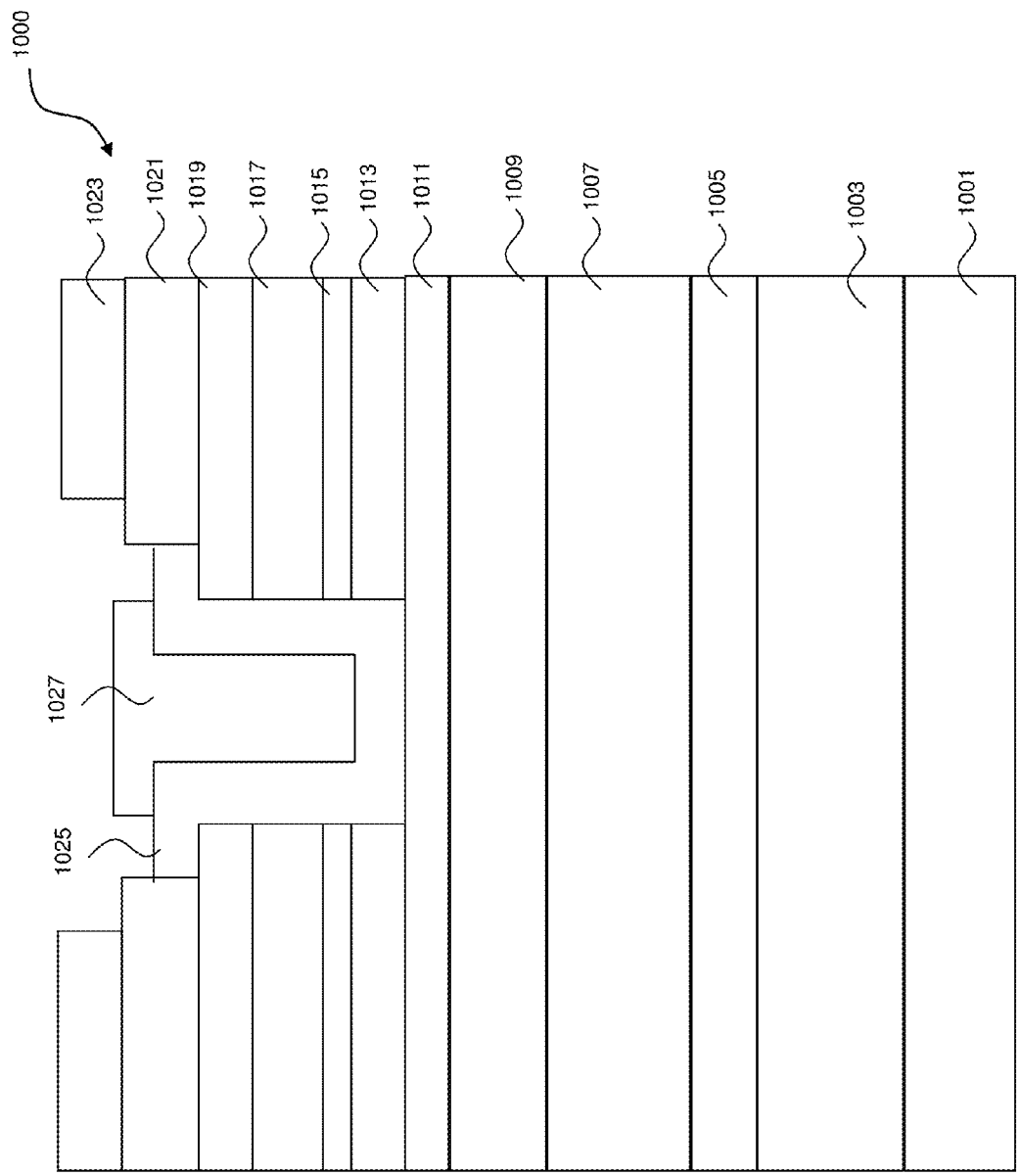
FIG. 10 illustrates the dielectric layer being utilized as a gate dielectric in a III-V metal gate transistor in accordance with an embodiment.

FIG. 10 illustrates yet another embodiment in which either the deposited layer 201 or the composite dielectric layer 501 may be utilized as a third gate dielectric 1025 in a III-V high-k metal gate structure 1000. In this embodiment the III-V high-k metal gate structure 1000 may comprise a 4° (100) offcut silicon substrate 1001, a GaAs nucleation and buffer layer 1003 that is 0.7 μm in thickness, an $In_{0.52}Al_{0.48}As$ buffer 1005 that is 0.7 μm in thickness, an $In_{0.52}Al_{0.48}As$ bottom barrier layer 1007 that is 100 nm in thickness, an $In_{0.7}Ga_{0.3}As$ QW channel 1009 that is 10 nm in thickness, an InP layer 1011 that is 2 nm in thickness, an $In_{0.52}Al_{0.48}As$ layer 1013 that is 3 nm in thickness, a silicon δ-doping layer 1015, an $In_{0.52}Al_{0.49}As$ layer 1017 that is 3 nm in thickness, an InP etch stop layer 1019 that is 6 nm in thickness, a n++ InHaAs layer 1021 that is 20 nm in thickness, and source/drain regions 1023. In this embodiment the third gate dielectric 1025 (formed either through the first deposition process 300 by itself or in conjunction with the second deposition process 500) may be formed to extend through the $In_{0.52}Al_{0.48}As$ layer 1013, the silicon δ-doping layer 1015, the $In_{0.52}Al_{0.49}As$ layer 1017, the InP etch stop layer 1019, and the n++ InGaAs layer 1021, by, e.g., etching these layers and then forming the third gate dielectric 1025 using either the first deposition process 300 by itself or in combination with the second deposition process 500. Once the third gate dielectric 1025 has been formed, a gate electrode 1027 may be formed over the third gate dielectric 1025.

By utilizing either the deposited layer 201 or the composite dielectric layer 501 formed using either the first deposition process 300 by itself or the first deposition process 300 in conjunction with the second deposition process 500, the third gate dielectric 1025 within the III-V high-k metal gate structure 1000 may have an increased density and a reduced number of defects count. Additionally, any leakage that may occur in devices utilizing the dielectric layers may be reduced, thereby increasing the efficiency of the devices.

In an embodiment, a method for manufacturing a semiconductor device comprising introducing a first precursor to a deposition chamber for a first time and introducing a first purge gas to the deposition chamber for a second time after the introducing the first precursor, wherein the second time is larger than the first time, is provided. A second precursor is introduced to the deposition chamber for a third time after the introducing the first purge gas, wherein the third time is larger than the first time. A second purge gas is introduced to the deposition chamber for a fourth time after the introducing the second precursor.

In another embodiment, a method for manufacturing a semiconductor device comprising performing a first cycle to form a first monolayer of a dielectric material is provided. The first cycle comprises reacting a surface of a substrate with a first precursor for a first time period to form a first precursor surface, purging the first precursor from the first precursor surface for a second time period, wherein the second time period is greater than the first time period, oxidizing the first precursor surface with a second precursor to form the first monolayer of the dielectric material, the oxidizing the first precursor surface occurring for a third time period, wherein the third period is greater than or equal to the first time period; and purging the second precursor from the first monolayer of the dielectric material for a fourth time period, wherein the fourth time period is greater than the third time period. A second cycle is performed to form a second monolayer of the dielectric material after the performing the first cycle.

In yet another embodiment, a semiconductor device comprising a first layer comprising a first material, the first layer comprising a first plurality of monolayers, the first plurality of monolayers having a first density, is provided. A second layer is over the first layer, the second layer comprising the first material, the second layer comprising a second plurality of monolayers, the second plurality of monolayers having a second density less than the first density.

Although the embodiments and their advantages have been described in detail, it should be understood that various changes, substitutions, and alterations can be made herein without departing from the spirit and scope of the embodiments as defined by the appended claims. For example, the placement of the first dielectric material and the second dielectric material within a composite dielectric may be reversed, with the second dielectric material being formed first and the first dielectric material being formed over the second dielectric material.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A semiconductor device comprising:
   a first layer comprising a first material, the first layer comprising a first plurality of monolayers, the first plurality of monolayers having a first density;
   a second layer over and in physical contact with the first layer, the second layer comprising the first material, the second layer comprising a second plurality of monolayers, the second plurality of monolayers having a second density less than the first density; and
   a third layer over and in physical contact with the second layer, the third layer comprising the first material and comprising a third plurality of monolayers, the third plurality of monolayers having a third density greater than the second density.

2. The semiconductor device of claim 1, wherein the first material comprises zirconium oxide.

3. The semiconductor device of claim 1, wherein the first layer has a higher concentration of oxygen than the second layer.

4. The semiconductor device of claim 1, further comprising a capacitor top electrode over the second layer.

5. The semiconductor device of claim 1, further comprising a gate electrode overlying the first layer and the second layer.

6. The semiconductor device of claim 5, wherein the gate electrode is part of a III-V high-k metal gate structure.

7. A semiconductor device comprising:
   a first layer of material over a substrate, wherein the first layer of material comprises a first plurality of monolayers with a first concentration of oxygen;
   a second layer of material over and in physical contact with the first layer of material, wherein the second layer of material comprises a second plurality of monolayers with a second concentration of oxygen different from the first concentration of oxygen; and
   a third layer of material over and in physical contact the second layer of material, wherein the third layer of material comprises a third plurality of monolayers with a third concentration of oxygen different from the second concentration of oxygen.

8. The semiconductor device of claim 7, wherein the second concentration of oxygen is less than the first concentration of oxygen.

9. The semiconductor device of claim 7, wherein the first plurality of monolayers has a first density and the second plurality of monolayers has a second density different from the first density.

10. The semiconductor device of claim 7, wherein the first layer of material and the second layer of material form a capacitor dielectric.

11. The semiconductor device of claim 7, wherein the first layer of material and the second layer of material form a gate dielectric.

12. The semiconductor device of claim 11, wherein the gate dielectric is part of a III-V high-k metal gate structure.

13. A semiconductor device comprising:
a first capacitor electrode over a substrate;
a second capacitor electrode over the first capacitor electrode; and
a capacitor dielectric between the first capacitor electrode and the second capacitor electrode, wherein the capacitor dielectric further comprises:
 a first region with a first density, wherein the first region comprises monolayers;
 a second region with a second density different from the first density, wherein the second region is adjacent and in physical contact with to the first region and wherein the second region comprises monolayers; and
 a third region with a third density different from the second density, wherein the third region is adjacent to and in physical contact with the second region.

14. The semiconductor device of claim 13, wherein the third density is substantially the same as the first density.

15. The semiconductor device of claim 13, wherein the first region and the second region comprise a first material.

16. The semiconductor device of claim 15, wherein the first material comprises zirconium oxide.

17. The semiconductor device of claim 13, wherein the first region comprises a first oxygen concentration and the second region comprises a second oxygen concentration different from the first oxygen concentration.

* * * * *